US008912803B2

(12) United States Patent
Mogaveera

(10) Patent No.: US 8,912,803 B2
(45) Date of Patent: Dec. 16, 2014

(54) ELECTROSTATIC SHIELDING TECHNIQUE ON HIGH VOLTAGE DIODES

(75) Inventor: Vasu Mogaveera, Andhra Pradesh (IN)

(73) Assignee: Honeywell International, Inc., Morristown, NJ (US)

( * ) Notice: Subject to any disclaimer, the term of this patent is extended or adjusted under 35 U.S.C. 154(b) by 441 days.

(21) Appl. No.: 13/235,808

(22) Filed: Sep. 19, 2011

(65) Prior Publication Data

US 2013/0069669 A1    Mar. 21, 2013

(51) Int. Cl.
*G01R 1/067* (2006.01)
*H01R 11/18* (2006.01)

(52) U.S. Cl.
CPC .................. *G01R 1/06777* (2013.01)
USPC .......... 324/555; 324/72.5; 324/114; 324/149; 702/60

(58) Field of Classification Search
CPC .......... G01R 31/021–31/026; G01R 31/06788; H01R 11/18
USPC ................. 324/457–458, 555, 149, 324/750.01–755.11; 702/62
See application file for complete search history.

(56) References Cited

U.S. PATENT DOCUMENTS

| 3,335,339 | A  | * | 8/1967 | Schuler ......................... 257/691 |
| 5,136,234 | A  | * | 8/1992 | Shaw ............................... 324/72 |
| 6,124,714 | A  | * | 9/2000 | McNulty et al. .............. 324/418 |
| 7,746,051 | B1 | * | 6/2010 | Buchanan et al. ........... 324/72.5 |
| 2001/0054902 | A1 | * | 12/2001 | Smith et al. .................... 324/544 |
| 2002/0093326 | A1 | * | 7/2002 | Bierer ........................... 324/72.5 |
| 2009/0189597 | A1 | * | 7/2009 | Lagerberg et al. ............ 324/133 |

* cited by examiner

*Primary Examiner* — Jermele M Hollington
*Assistant Examiner* — Emily Chan
(74) *Attorney, Agent, or Firm* — Wood, Phillips, Katz, Clark & Mortimer

(57) ABSTRACT

A DC high potential testing meter comprises first and second probes. The first probe comprises an insulated shield supporting an electrode extending from a distal end of the shield. A high voltage resistor and a high voltage diode in the shield are connected in series with the electrode. A capacitance formed by a metallic collar across the high voltage diode provides uniform voltage distribution along the high voltage diode. The second probe comprises an insulated shield supporting an electrode. A high voltage resistor in the shield is connected in series with the electrode. A meter comprises a housing enclosing an electrical circuit for measuring voltage across the electrodes and provides an output representing measured voltage.

20 Claims, 6 Drawing Sheets

ELECTROSTATIC SHIELDING TECHNIQUE ON HIGH VOLTAGE DIODES

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

This disclosure relates to a DC high potential testing meter with electrostatic shielding.

BACKGROUND

Electrical power distribution systems often include overhead electrical power distribution lines mounted upon poles by a wide variety of mounting structure. Other distribution systems include underground distribution lines in which protected cables run under the ground surface. It is often necessary to take phase-to-phase or phase-to-ground voltage measurements across distribution and transmission lines while testing for induced or live power line or equipment.

Known high voltage safety line detectors, meters and testers comprise high resistance probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized.

A DC high potential (HIPOT) test has been used to test the serviceability of underground AC high voltage power cables before the cables are placed in service at a substation and distribution electric lines of the power system. The DC HIPOT test is applied to the cable to verify that the cable is good for high voltage use. To conduct the test a high DC voltage is placed across the cable conductor and shield. The test is performed to ensure the status of the cable insulation, whether it is good or faulty before placing the cable in service.

One known high voltage DC HIPOT test meter comprises a high voltage phasing meter along with a high voltage diode. The high voltage diode is placed in series with one of the meter probes. The DC high voltage is converted from the high voltage AC by use of the high voltage diode. The phasing meter can then be used as a cable testing device. The high voltage diode may consist of a plurality of high voltage diodes connected in series, as shown in FIG. 4. This is done to ensure that the diodes can withstand the required voltages during the reverse bias state. Advantageously, there should be a uniform voltage distribution across each high voltage diode. However, stray capacitance between the diodes to the ground, as shown in FIG. 4, creates instability. The voltage stress will not be uniform across each diode due to stray capacitance. The voltage stress will be more than double the uniform stress at the diodes near to the high voltage side. This leads to degradation of the diodes at the high voltage side. This can result in failure of the string of diodes over the period of operation so that the system may become non-performing.

The disclosure is directed to improvements in DC high potential testing meters.

SUMMARY

As described herein, a DC high potential testing meter compensates for stray capacitance across the probe diode.

Particularly, a DC high potential testing meter comprises first and second probes. The first probe comprises an insulated shield supporting an electrode extending from a distal end of the shield. A high voltage resistor and a high voltage diode in the shield are connected in series with the electrode. A capacitance, formed by metallic collars, across the high voltage diode provides uniform voltage distribution along the high voltage diode. The second probe comprises an insulated shield supporting an electrode. A high voltage resistor in the shield is connected in series with the electrode. A meter comprises a housing enclosing an electrical circuit for measuring voltage across the electrodes and provides an output representing measured voltage.

It is a feature that the capacitance comprises a first metallic collar at one end of the high voltage diode and a second metallic collar at another end of the high voltage diode. The first metallic collar may be of a different size than the second metallic collar. The first metallic collar may be larger than the second metallic collar. The first metallic collar may have a greater diameter than the second metallic collar. The first metallic collar may have a greater thickness than the second metallic collar.

It is a further feature that the first metallic collar and the second metallic collar support the high voltage diode in the shield.

It is another feature that the high voltage diode comprises a plurality of series connected high voltage diodes.

It is still another feature that the first probe comprises a DC probe including the high voltage diode and a meter probe including the high voltage resistor. The DC probe is selectively connected to the meter probe.

There is also disclosed a DC high potential testing meter comprising a DC probe and a first meter probe and a second meter probe. The DC probe comprises an insulated shield supporting an electrode extending from a distal end of the shield. A high voltage diode in the shield is connected in series with the electrode. A capacitance formed by a metallic collar across the high voltage diode provides uniform voltage distribution along the high voltage diode. The first meter probe comprises an elongate insulated shield having a handle portion at one end and a first high voltage resistor in the shield. The first meter probe is selectively connected to the DC probe whereby the first high voltage resistor is in series with the high voltage diode. The second meter probe comprises an elongate insulated shield having a handle portion at one end. An electrode extends from a distal end of the shield. A high voltage resistor is in the shield. A meter comprises a housing enclosing an electrical circuit for measuring voltage across the electrodes and provides an output representing measured voltage.

Other features and advantages will be apparent from a review of the entire specification, including the appended claims and drawings.

DETAILED DESCRIPTION

Figure 1:
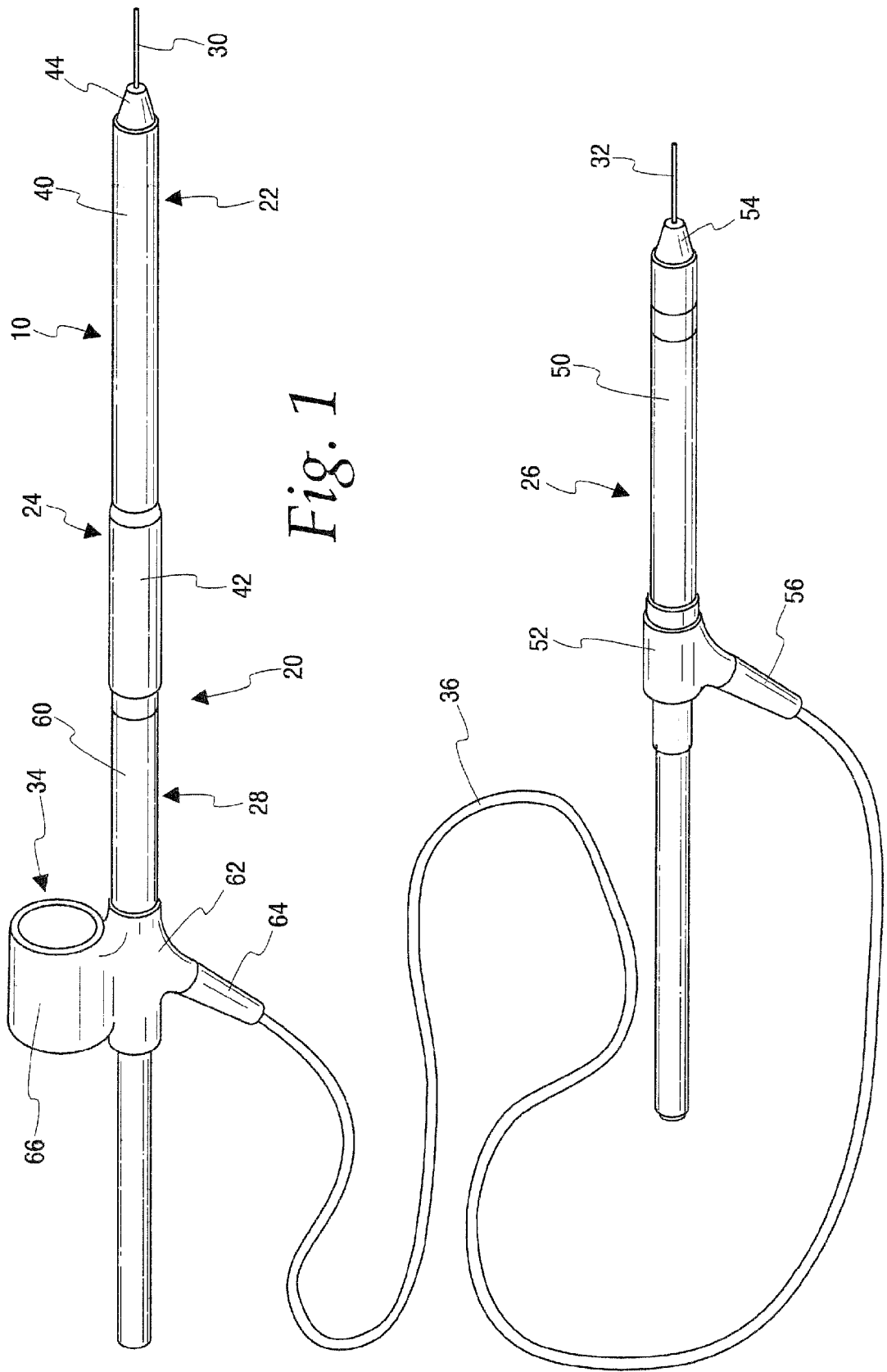
FIG. 1 is a perspective view of a DC high potential testing meter.

Referring initially to FIG. 1, a DC high potential (HIPOT) testing meter 10 is shown for performing a DC HIPOT test. Particularly, the testing meter 10 is used, as discussed below, along with a high voltage AC source for testing the ability of a high voltage cable to withstand a high DC voltage.

The testing meter 10 comprises a high voltage phasing meter 20 and a DC HIPOT probe 22. Particularly, the testing meter 10 comprises a first probe 24 and a second probe 26. The first probe 24 comprises the DC HIPOT probe 22 affixed to a first meter probe 28 of the phasing meter 20. The second probe 26 also comprises a second meter probe of the phasing meter 20. The phasing meter 20, without the DC HIPOT probe 22, can be used for measuring phase-to-phase voltage of a high voltage transmission line system, as is known. The testing meter 10 further comprises a first electrode 30, a second electrode 32, a meter 34 and a cable 36.

The DC HIPOT probe 22 comprises an elongate insulated shield 40 connected to a gripping portion 42 at a near end and a terminal 44 at a distal end. The terminal 44 is adapted to threadably receive the electrode 30.

The second probe 26 comprises an elongate insulated shield 50 connected to a handle portion 52 at a near end and a terminal 54 at a distal. The terminal 54 is adapted to threadably receive the electrode 32. A coaxial connector 56 in the handle 52 is adapted to receive the cable 36.

The first meter probe 28 is generally similar to the second meter probe 26 and includes an elongate insulated shield 60 connected to a handle portion 62 at a near end and a terminal (not shown) at a distal end. In the illustrated embodiment, the gripping portion 42 of the DC HIPOT probe 22 is telescopically received over the distal end of the elongate shield 60 and is electrically connected to the terminal therein. Otherwise, upon removal of the DC HIPOT probe 22, the electrode 30 could be threadably secured to the terminal of the first meter probe 28. A coaxial connector 64 is provided in the handle portion 62 for connecting to the cable 36.

The meter 34 comprises a housing 66 integrally formed with the first probe handle portion 62. The housing 66 includes a display 35, see FIG. 2, to display the measured voltage between the electrodes 30 and 32.

As will be apparent, the DC HIPOT probe 22 and the first meter probe 28 could be formed as a unitary probe.

Figure 2:
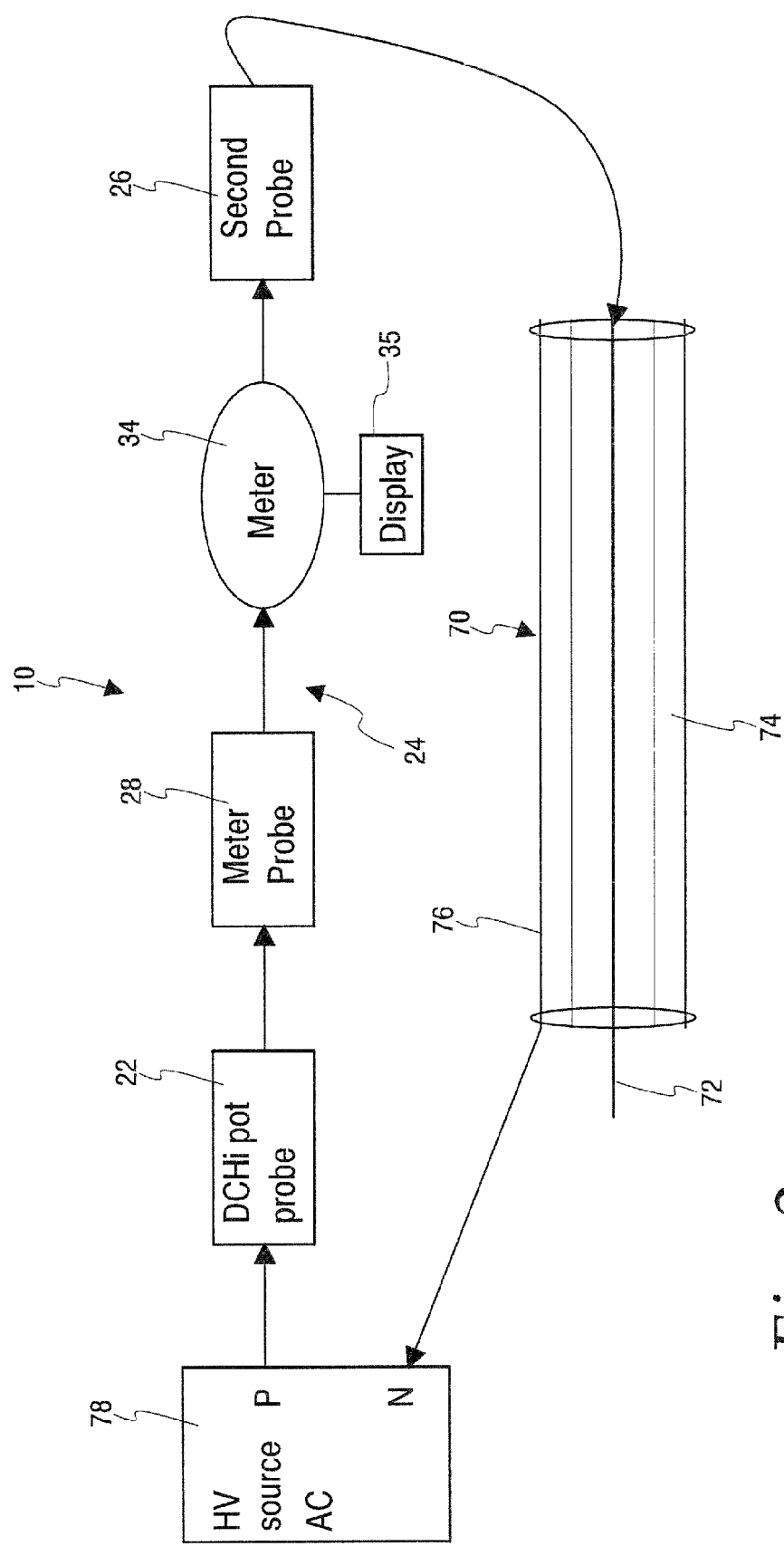
FIG. 2 is a block diagram illustrating use of the testing meter of FIG. 1.

Referring to FIG. 2, a block diagram illustrates use of the testing meter 10 for performing a DC HIPOT test on a cable 70. The cable 70 includes a cable conductor 72 surrounded by an insulator 74 and having a shield 76. The test is performed using a high voltage AC source 78. The DC HIPOT probe 22 will be connected to the high side of the high voltage AC source 78, the neutral of which is connected to the shield 76 in any known manner. The second probe 26 is used to contact the cable conductor 72 via the electrode 32. The phase of the AC high voltage source 78 will be applied to the DC HIPOT probe 22 where it will be rectified into a high DC voltage and fed to the high voltage phasing meter 24. If the cable 70 is good, i.e., there is no insulation breakdown, then the meter display 35 will show a near zero voltage. If the cable 70 breaks down, then the meter display 35 will show the full applied voltage. If the high voltage cable 70 is found to be good, in the sense that there is no insulation breakdown, then the cable 70 will be used for the high voltage power transmission.

Figure 3:
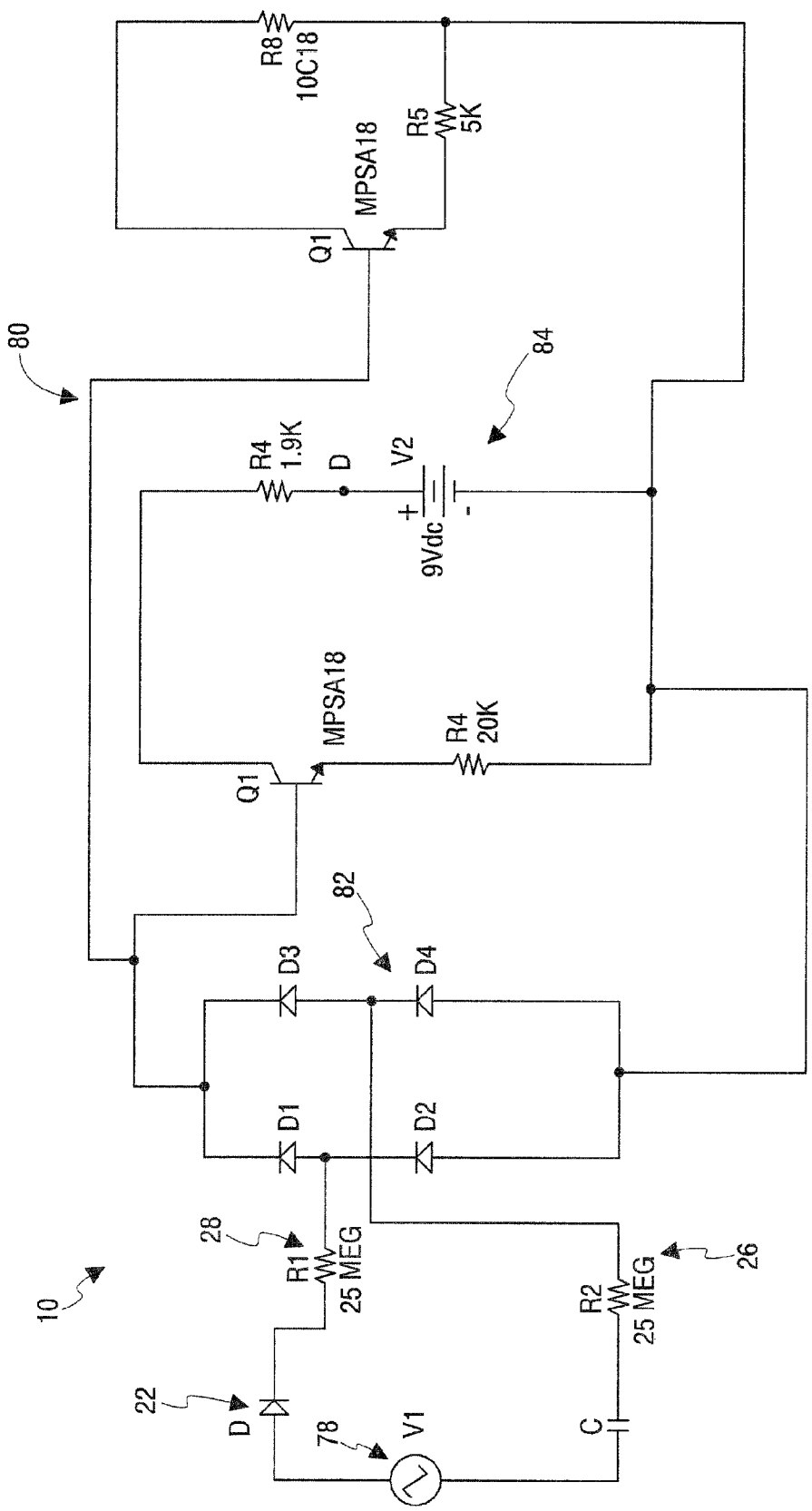
FIG. 3 is an electrical schematic of the DC high potential testing meter.

Referring to FIG. 3, an electrical circuit 80 for the meter 34, see FIGS. 1 and 2, is illustrated. The electrical circuit 80 uses the micro-ammeter method for measuring voltage. The DC HIPOT probe 22 comprises a high voltage diode D. The first meter probe 28 comprises a first high voltage resistor R1. The second meter probe 26 comprises a second high voltage resistor R2. The high voltage source 78 is represented by the voltage V1. With the DC HIPOT probe 22 secured to the first meter probe 28 as in FIG. 1, the diode D and first high voltage resistor R1 are connected in series. The resistors R1 and R2 are connected via the cable 36, see FIG. 1, in a conventional manner to the electrical circuit 80. The electrical circuit 80 includes a rectifier circuit 82 connected to the probe resistors R1 and R2. The electrical circuit 80 is powered by a battery V2. The battery V2 powers a measurement circuit 84 including a node D which develops the output representing measured voltage and can be supplied to the display 35, see FIG. 2. As is apparent, the electrical circuit 80 could take other known forms, such as a voltage divider type circuit, or the like.

The circuit of FIG. 3 shows a capacitor C. The capacitor C represents the cable 70 being tested as the cable when connected as shown in FIG. 2 acts as a capacitor to the overall circuit.

Figure 4:
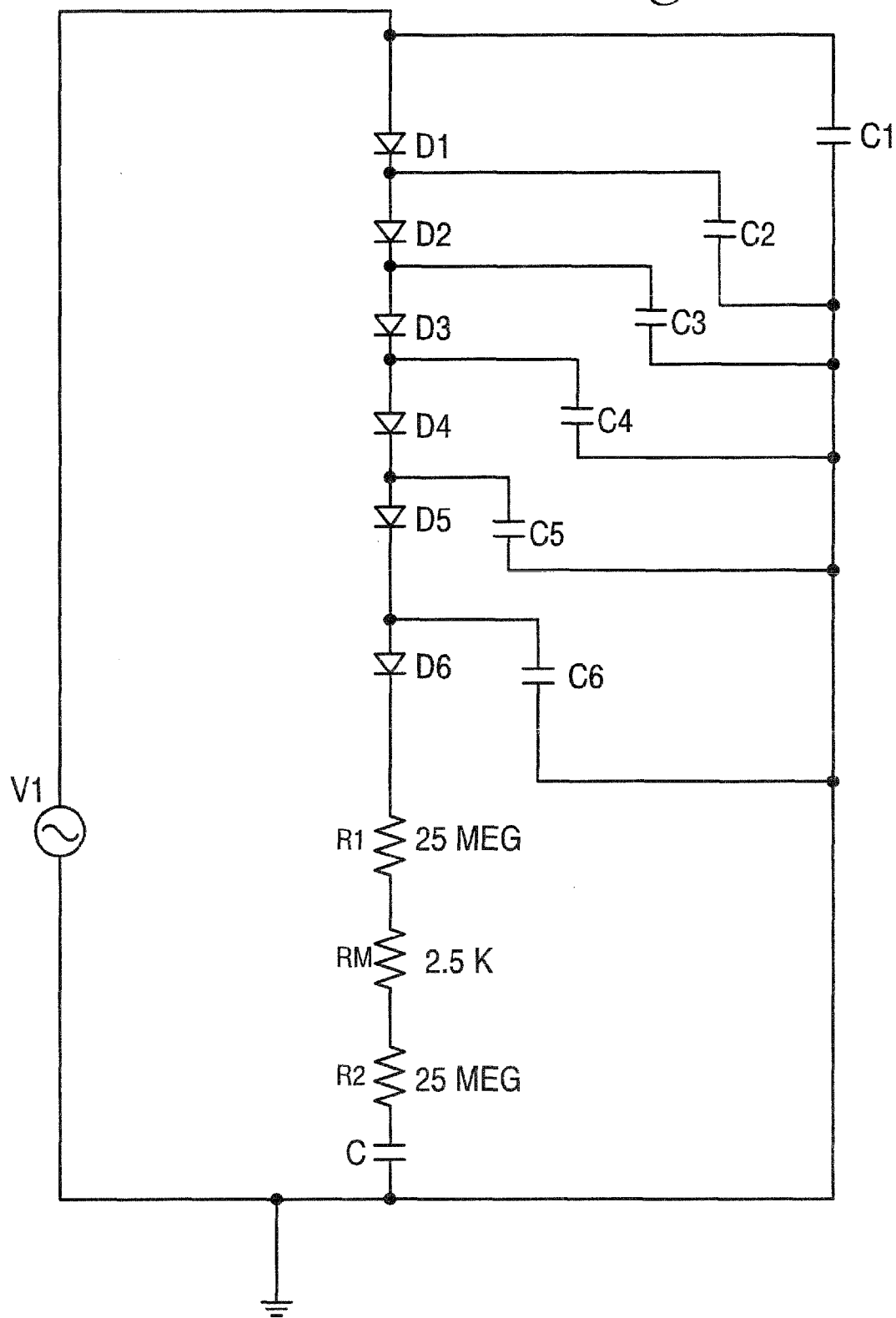
FIG. 4 is an electrical schematic illustrating stray capacitance effect on the high voltage rectifiers in an equivalent circuit for the circuit of FIG. 3.

The high voltage AC source may have an amplitude on the order of 25 to 50 kilovolts. The diode D must be capable of withstanding such a voltage. As disclosed herein, the diode D comprises a plurality of series connected high voltage diodes labeled as diodes D1, D2, D3, D4, D5 and D6, see FIG. 4. In the circuit of FIG. 4 the measurement circuit is represented by an equivalent resistance RM. Under normal operation, during diode reverse bias conditions, the voltage across each diode D1-D6 will be different due to stray capacitance effects as shown by capacitors C1, C2, C3, C4, C5 and C6 from the respective diodes D1-D6 to ground. Ideally, the current flowing through each of the high voltage diodes D1-D6 should be the same. However, the currents are not due to the stray capacitance. Part of the circuit current will be diverted at each diode D1-D6 to ground. The voltage drop across each diode is a function of the reverse bias resistance of each high voltage diode D1-D6 and is assumed as the same resistance value in each diode. However, as the currents are not equal, the voltage drop will not be the same. This results in unequal voltage distribution across each diode D1-D6. The unequal voltage distribution provides non-uniform stresses which will be higher at the high voltage sides where the diodes D1 and D2 are located with less stress at the lower voltage side where the diodes D5 and D6 are located. This non-linear stress distribution leads to the degrading of the diodes D1-D6 and can lead to failure over a period of time.

Figure 6:
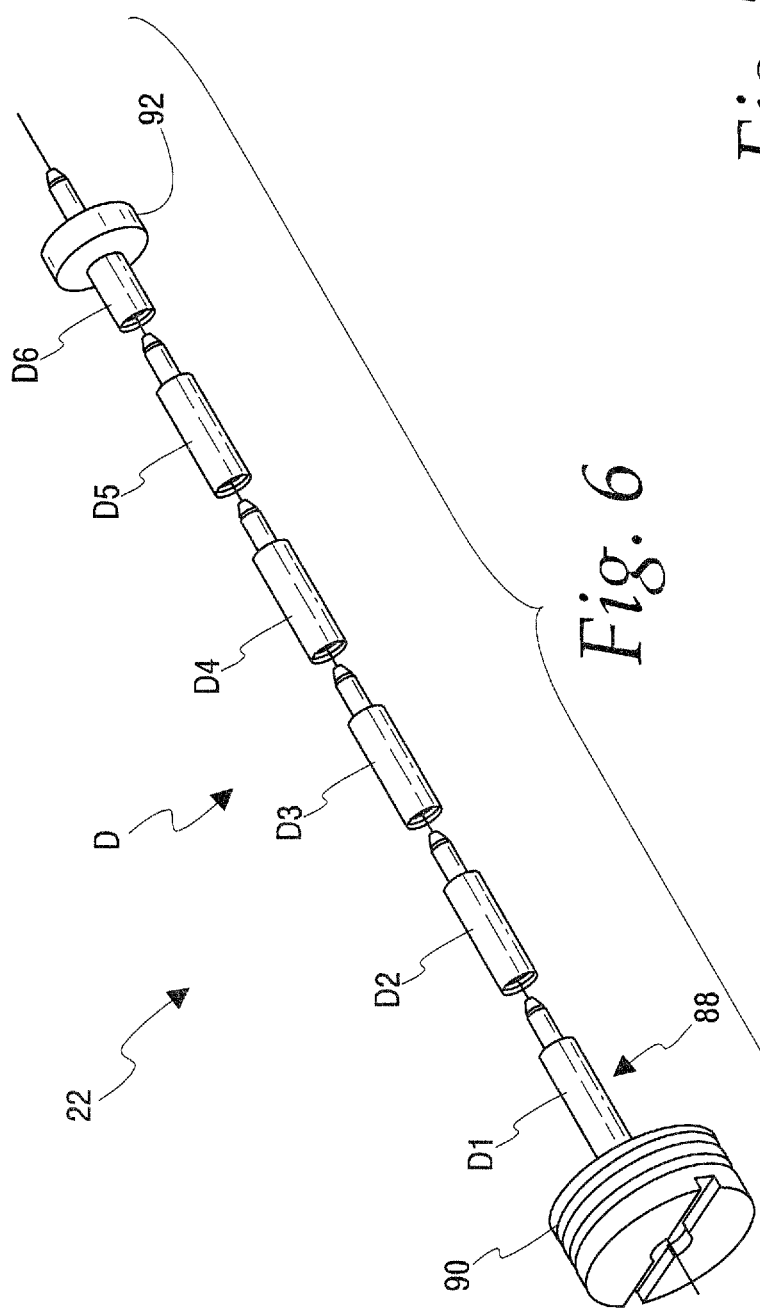
FIG. 6 is an exploded perspective view of the high voltage diode probe for the testing meter including electrostatic shielding.
Figure 7:
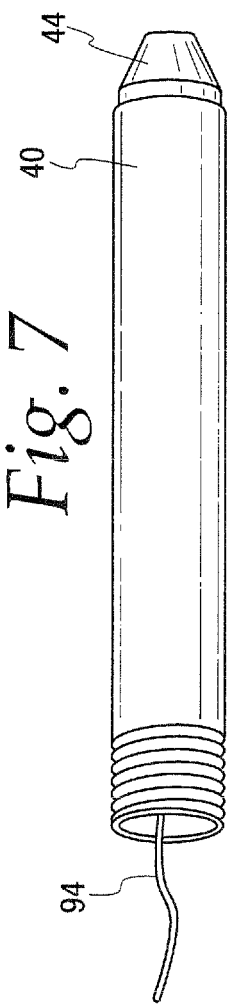
FIG. 7 is a perspective view showing the assembled diode probe.

Referring to FIG. 6, the internal components of the DC HIPOT probe 22 are illustrated comprising the series connected diodes D1-D6. A capacitance 88 is formed by a metallic collar, as described below, connected across the diodes D1-D6 to be used as an electrostatic shield. The shield compensates for stray capacitance and provides uniform voltage drop across each individual high voltage diode D1-D6. The capacitance 88 is formed by a first metallic shield or collar 90 at one end of the DC HIPOT probe 22 and a second metallic shield or collar 92 at an opposite end of the DC HIPOT probe 22. The first collar 90 is of a different size than the second collar 92. More particularly, the first collar 90 is larger than the second collar 92. In the illustrated embodiment, the first collar 90 has a diameter on the order of 22.5 mm and a thickness of 10 mm. The second collar 92 has a diameter of about 12 mm and a thickness of about 4 mm. As is apparent, other sizes could be used. The collars 90 and 92 sandwich the individual high voltage diodes D1-D6. The assembly of FIG. 6 is then inserted in the shield 40 with a lead 94 extending therefrom. The gripping portion 42 and appropriate connectors can then be installed on the shield 40 to provide the connection to the first meter probe 28, as will be apparent.

Figure 5:
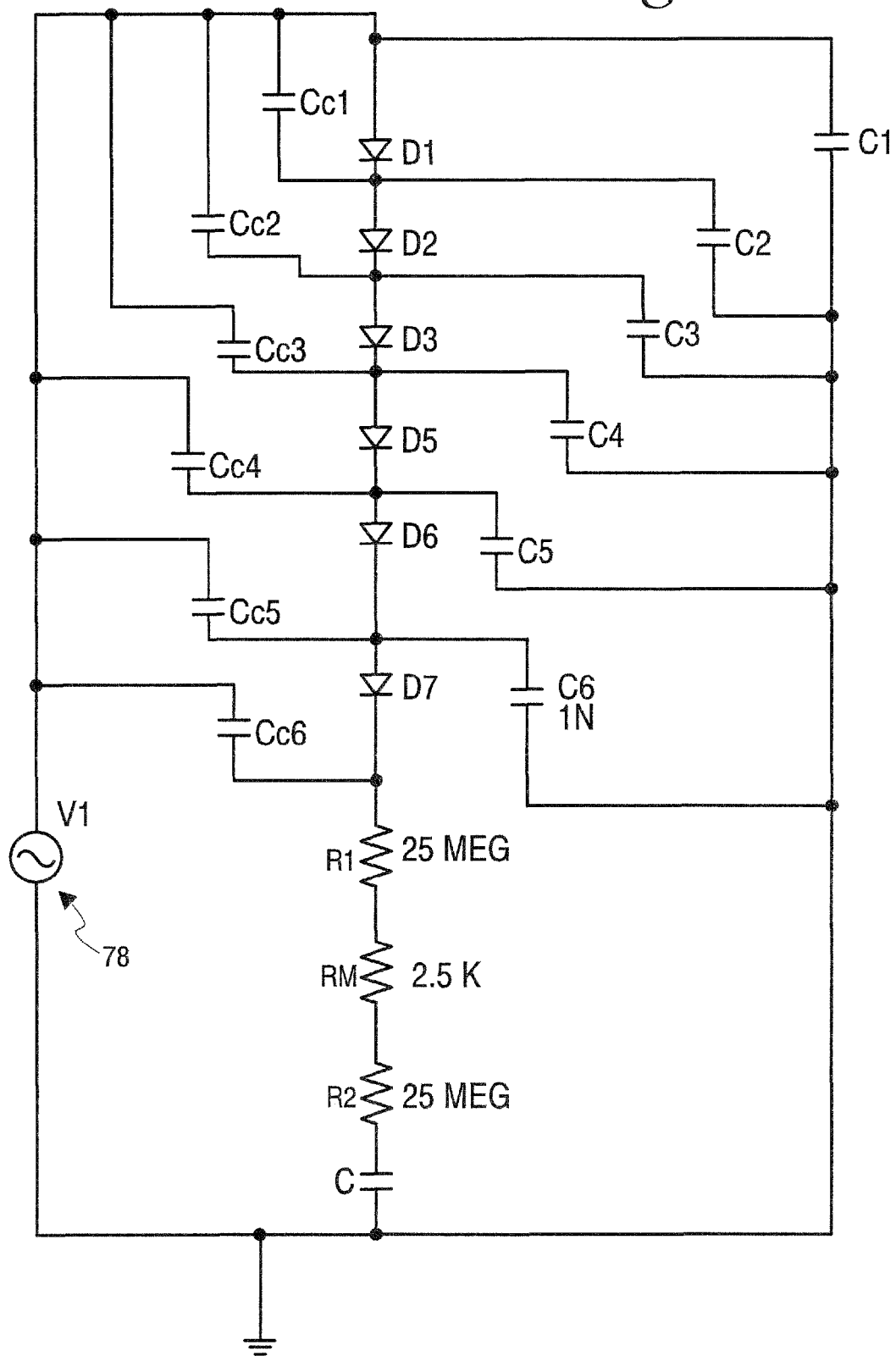
FIG. 5 is an electrical schematic, similar to FIG. 4, illustrating an electrostatic shielding technique as described herein.

Use of the metallic collars 90 and 92 having different diameters and thickness in place at both ends of the high voltage diode D forms a capacitance from the collars 90 and 92 to the individual high voltage diodes D1-D6 in the form of compensative capacitance, as shown in FIG. 5. This is illustrated as capacitance components CC1-CC6 connected between the respective diodes D1-D7 and the high voltage side of the AC source 78. The stray capacitance represented as C1-C6 will be approximately compensated by the metallic shielding compensated capacitance CC1-CC6. This makes the voltage drop across each high voltage diode D1-D6 to be almost equal during reverse bias conditions. Additionally, the collars 90, 92 provide better mechanical support for the diode mounting in the DC HIPOT probe shield 40. An epoxy potting can be used to secure the assembly within the shield 40.

Thus, the use of the string of series connected diodes D1-D6 along with the shielding provides uniform voltage distribution so that electrical stress will be uniform across each diode D1-D6.

Thus, in accordance with the disclosed DC HIPOT probe 22, there is provided uniform voltage distribution owing to stray capacitance effects being compensated. A better electrical stress distribution is provided along the length of the series of high voltage diodes D1-D6 to ensure reliability. Particularly, the stray capacitance effect is minimized by the use of the metallic circular collars 90 and 92 placed at opposite ends of the DC HIPOT probe 22 to make voltage distribution more linear.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other embodiments may be within the scope of the following claims.

The invention claimed is:

1. A DC high potential testing meter comprising:
a first probe comprising an insulated shield supporting an electrode extending from a distal end of the shield, a high voltage resistor and a high voltage diode in the shield connected in series with the electrode, and a capacitance, formed by a metallic collar, across the high voltage diode to provide uniform voltage distribution along the high voltage diode;
a second probe comprising an insulated shield supporting an electrode extending from a distal end of the shield and a high voltage resistor connected in series with the electrode; and
a meter operatively connected to the first and second probes comprising a housing enclosing an electrical circuit for measuring voltage across the electrodes and providing an output representing measured voltage.

2. The DC high potential testing meter of claim 1 wherein the capacitance comprises a first metallic collar at one end of the high voltage diode and a second metallic collar at another end of the high voltage diode.

3. The DC high potential testing meter of claim 2 wherein the first metallic collar is of a different size than the second metallic collar.

4. The DC high potential testing meter of claim 2 wherein the first metallic collar is larger than the second metallic collar.

5. The DC high potential testing meter of claim 2 wherein the first metallic collar has a greater diameter than the second metallic collar.

6. The DC high potential testing meter of claim 2 wherein the first metallic collar has a greater thickness than the second metallic collar.

7. The DC high potential testing meter of claim 2 wherein the first metallic collar and the second metallic collar support the high voltage diode in the shield.

8. The DC high potential testing meter of claim 1 wherein the high voltage diode comprise a plurality of series connected high voltage diodes.

9. The DC high potential testing meter of claim 1 wherein the first probe comprises a DC probe, including the high voltage diode and the metallic collar across the high voltage diode, and a meter probe including the high voltage resistor.

10. The DC high potential testing meter of claim 9 wherein the DC probe is selectively connected to the meter probe.

11. A DC high potential testing meter comprising:
a DC probe comprising an insulated shield supporting an electrode extending from a distal end of the shield, a high voltage diode in the shield connected in series with the electrode, and a capacitance, formed by a metallic collar, across the high voltage diode to provide uniform voltage distribution along the high voltage diode;
a first meter probe comprising an elongate insulated shield having a handle portion at one end and a first high voltage resistor in the shield, the first meter probe being selectively connected to the DC probe whereby the first high voltage resistor is in series with the high voltage diode;
a second meter probe comprising an elongate insulated shield having a handle portion at one end, an electrode extending from a distal end of the shield, and a high voltage resistor in the shield; and
a meter operatively connected to the first and second meter probes comprising a housing enclosing an electrical circuit for measuring voltage across the electrodes and providing an output representing measured voltage.

12. The DC high potential testing meter of claim 11 wherein the capacitance comprises a first metallic collar at one end of the high voltage diode and a second metallic collar at another end of the high voltage resistor.

13. The DC high potential testing meter of claim 12 wherein the first metallic collar is of a different size than the second metallic collar.

14. The DC high potential testing meter of claim 12 wherein the first metallic collar is larger than the second metallic collar.

15. The DC high potential testing meter of claim 12 wherein the first metallic collar has a greater diameter than the second metallic collar.

16. The DC high potential testing meter of claim 12 wherein the first metallic collar has a greater thickness than the second metallic collar.

17. The DC high potential testing meter of claim 12 wherein the first metallic collar and the second metallic collar support the high voltage resistor in the shield.

18. The DC high potential testing meter of claim 11 wherein the high voltage diode comprise a plurality of series connected high voltage diodes.

19. The DC high potential testing meter of claim 18 wherein the meter housing is integral with the handle portion of the first meter probe.

20. The DC high potential testing meter of claim 12 wherein the first and second metallic collars are secured in the shield with a potting compound.

* * * * *